(12) United States Patent
Liaw

(10) Patent No.: US 10,043,571 B1
(45) Date of Patent: Aug. 7, 2018

(54) SRAM STRUCTURE

(71) Applicant: Taiwan Semiconductor Manufacturing Co., Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/672,426

(22) Filed: Aug. 9, 2017

(51) Int. Cl.
  *G11C 11/419* (2006.01)
  *G11C 11/417* (2006.01)
  *H01L 27/11* (2006.01)
  *G11C 5/06* (2006.01)
  *H01L 27/02* (2006.01)

(52) U.S. Cl.
  CPC ............ *G11C 11/417* (2013.01); *G11C 5/063* (2013.01); *G11C 11/419* (2013.01); *H01L 27/0207* (2013.01); *H01L 27/11* (2013.01)

(58) Field of Classification Search
  CPC ................................. G11C 11/419; G11C 7/08
  USPC .................................................... 365/72, 205
  See application file for complete search history.

(56) References Cited

U.S. PATENT DOCUMENTS 9,219,067 B2 * 12/2015 Kumar ................ H01L 27/1052
9,391,080 B1 * 7/2016 Kim .................... H01L 27/1104
2008/0123462 A1 * 5/2008 Liaw ........................ G11C 8/16
  365/230.05
2010/0259971 A1 * 10/2010 Liaw ........................ G11C 8/16
  365/154
2011/0317477 A1 * 12/2011 Liaw ........................ G11C 8/16
  365/156
2013/0154027 A1 * 6/2013 Liaw ..................... G11C 11/412
  257/390
2013/0258759 A1 * 10/2013 Liaw ..................... G11C 11/412
  365/154
2014/0254246 A1 * 9/2014 Liaw ................... H01L 29/6681
  365/154
2017/0154671 A1 * 6/2017 Liaw ..................... G11C 11/412
2018/0005938 A1 * 1/2018 Liaw ..................... H01L 23/528

* cited by examiner

*Primary Examiner* — Michael Tran
(74) *Attorney, Agent, or Firm* — McClure, Qualey & Rodack, LLP

(57) ABSTRACT

SRAM structures are provided. A SRAM structure includes multiple SRAM cells arranged in multiple rows and multiple columns. The SRAM cells in the same row are divided into multiple groups. Each group includes a first SRAM cell and a second SRAM cell adjacent to the first SRAM cell. The first and second Vss lines and the first and second word-line landing pads are formed in a first metallization layer and extend parallel to a first direction. The third Vss line and the first word line are formed in a second metallization layer and extend parallel to a second direction. The first word-line landing pad is positioned within the rectangular shape of the first or second SRAM cell, and the second word-line landing pad is positioned within the rectangular shape of the second SRAM cell. The second metallization layer is positioned on the first metallization layer.

20 Claims, 12 Drawing Sheets

//* ## SRAM STRUCTURE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Static Random Access Memory (SRAM) is commonly used in integrated circuits. SRAM cells have the advantageous feature of being able to hold data without the need to refresh. With the increasingly demanding requirements on the speed of integrated circuits, the read speed and write speed of SRAM cells have also become more important. With the increasing down-scaling of the already very small SRAM cells, however, such requests are difficult to achieve. For example, the sheet resistance of metal lines, which form the word-lines and bit-lines of SRAM cells, becomes higher, and hence the RC delay of the word lines and bit-lines of SRAM cells is increased, preventing any substantial improvements in the read speed and write speed.

Therefore, it is desired to provide a metal routing structure for the SRAM cells, so as to achieve better cell performance when the SRAM cells continue to shrink.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
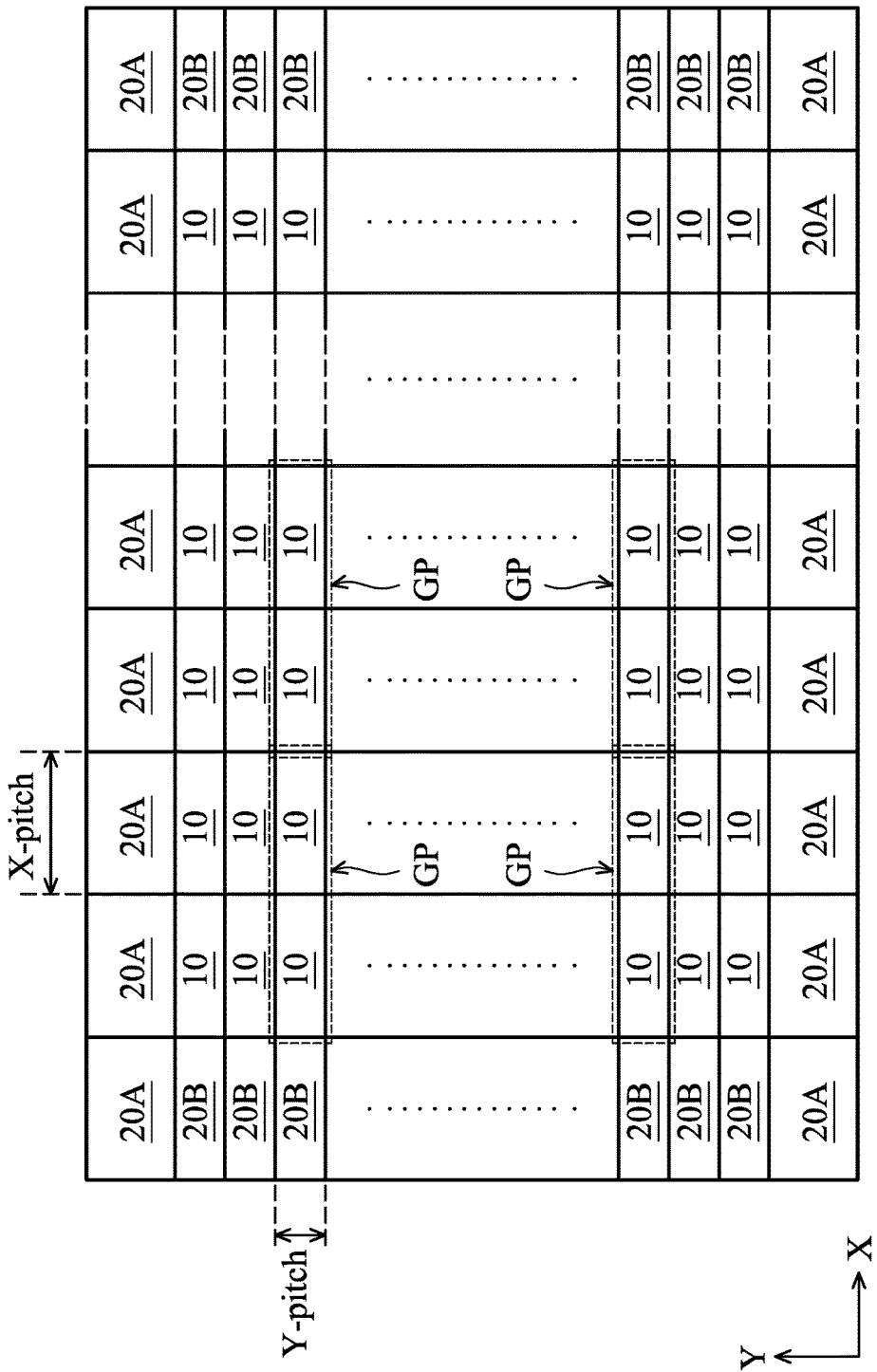
FIG. 1 shows a simplified diagram of a SRAM, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and second nodes are formed in direct contact, and may also include embodiments in which additional nodes may be formed between the first and second nodes, such that the first and second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

A static random access memory (SRAM) cell and the corresponding SRAM cell structure (e.g. a SRAM array) are provided in accordance with various exemplary embodiments. Some variations of some embodiments are discussed. Throughout the various views and illustrative embodiments, like reference numbers are used to designate like elements.

FIG. 1 shows a simplified diagram of a SRAM 30, in accordance with some embodiments of the disclosure. The SRAM 30 can be an independent device or be implemented in an integrated circuit (e.g. System on Chip (SOC)). The SRAM 30 includes a cell array formed by multiple SRAM cells (or called bit cells) 10, and the SRAM cells 10 are arranged in multiple rows and multiple columns in the cell array.

In the fabrication of SRAM cells, the cell array may be surrounded by multiple strap cells 20A and multiple edge cells 20B, and the strap cells 20A and the edge cells 20B are dummy cells for the cell array. In some embodiments, the strap cells 20A are arranged to surround the cell array horizontally, and the edge cells 20B are arranged to surround the cell array vertically. The shapes and sizes of the strap cells 20A and the edge cells 20B are determined according to actual application. In some embodiments, the shapes and sizes of the strap cells 20A and the edge cells 20B are the same as the SRMA cells 10. In some embodiments, the shapes and sizes of the strap cells 20A, the edge cells 20B and the SRAM cells 10 are different.

In the SRAM 30, each SRAM cell 10 has the same rectangular shape/region with an X-pitch and a Y-pitch, and the Y-pitch is shorter than the X-pitch. In some embodiments, the ratio of the X-pitch to the Y-pitch is greater than 2, i.e., X-pitch/Y-pitch >2.

In the cell array of the SRAM 30, the SRAM cells 10 in the same row are divided into multiple groups GP, and each group GP includes two adjacent SRAM cells 10 and a metal routing structure on the two adjacent SRAM cells 10. The groups GP will be described in detail below.

Figure 2A:
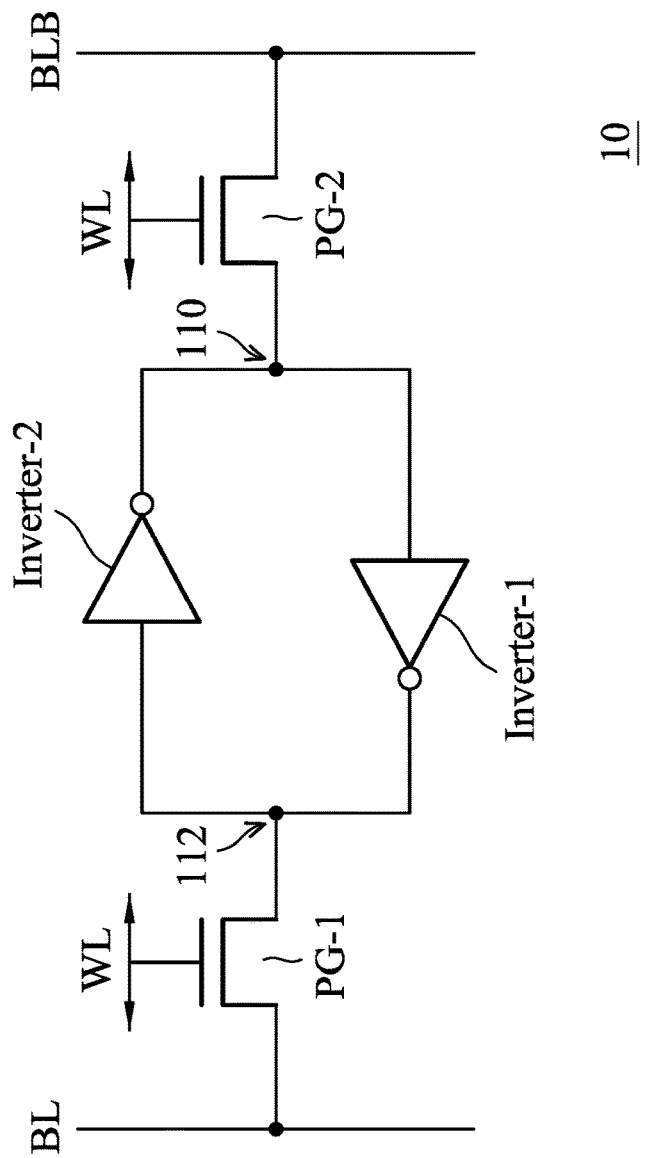
FIG. 2A shows a single-port SRAM cell, in accordance with some embodiments of the disclosure.

FIG. 2A shows a single-port SRAM cell 10, in accordance with some embodiments of the disclosure. The bit cell 10 includes a pair of cross-coupled inverters Inverter-1 and Inverter-2, and two pass-gate transistors PG-1 and PG-2. The inverters Inverter-1 and Inverter-2 are cross-coupled between the nodes 112 and 110, and form a latch. The pass-gate transistor PG-1 is coupled between a bit line BL and the node 112, and the pass-gate transistor PG-2 is coupled between a complementary bit line BLB and the node 110, wherein the complementary bit line BLB is complementary to the bit line BL. The gates of the pass-gate transistors PG-1 and PG-2 are coupled to the same word-line WL. Furthermore, the pass-gate transistors PG-1 and PG-2 are NMOS transistors.

Figure 2B:
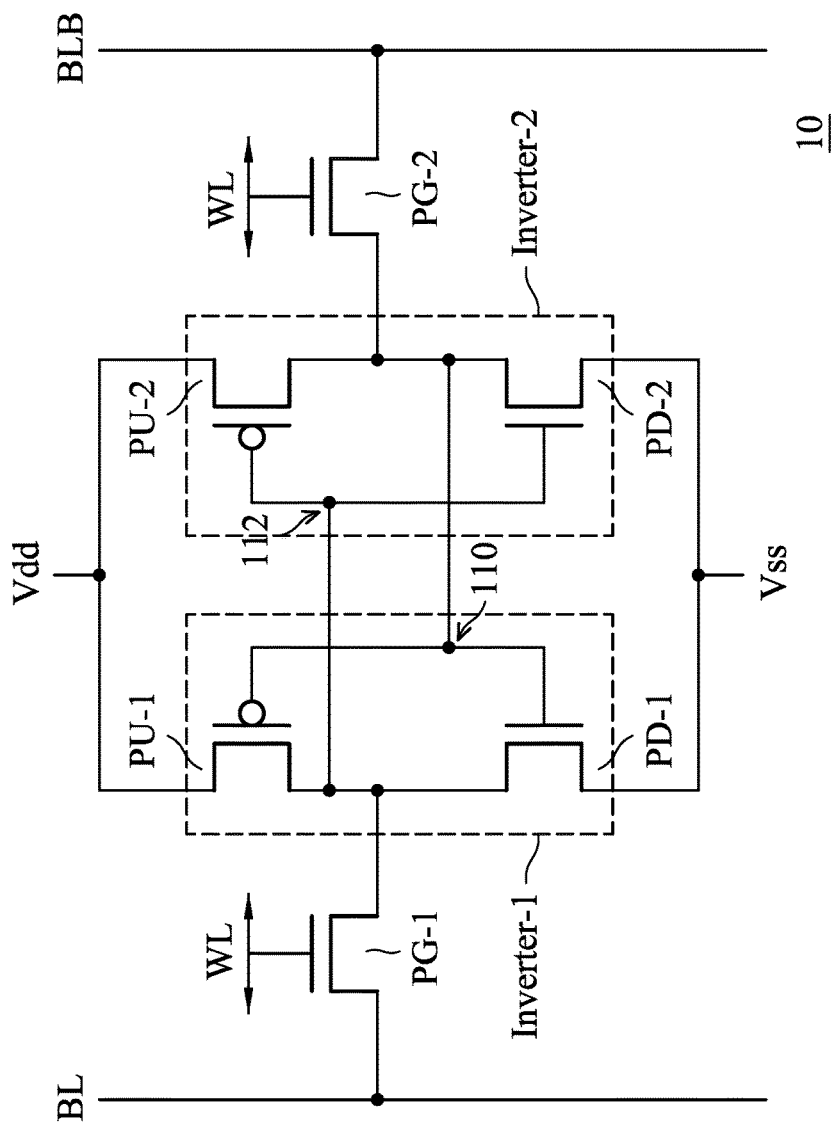
FIG. 2B shows a simplified diagram of the SRAM cell of FIG. 2A, in accordance with some embodiments of the disclosure.

FIG. 2B shows a simplified diagram of the SRAM cell 10 of FIG. 2A, in accordance with some embodiments of the disclosure. The inverter Inverter-1 includes a pull-up transistor PU-1 and a pull-down transistor PD-1. The pull-up transistor PU-1 is a PMOS transistor, and the pull-down transistor PD-1 is an NMOS transistor. The drain of the pull-up transistor PU-1 and the drain of the pull-down transistor PD-1 are coupled to the node 112 connecting the pass-gate transistor PG-1. The gates of the pull-up transistor PU-1 and the pull-down transistor PD-1 are coupled to the node 110 connecting the pass-gate transistor PG-2. Furthermore, the source of the pull-up transistor PU-1 is coupled to the positive power supply node Vdd, and the source of the pull-down transistor PD-1 is coupled to a ground Vss.

Similarly, the inverter Inverter-2 includes a pull-up transistor PU-2 and a pull-down transistor PD-2. The pull-up transistor PU-2 is a PMOS transistor, and the pull-down transistor PD-2 is an NMOS transistor. The drains of the pull-up transistor PU-2 and the pull-down transistor PD-2 are coupled to the node 110 connecting the pass-gate transistor PG-2. The gates of the pull-up transistor PU-2 and the pull-down transistor PD-2 are coupled to the node 112 connecting the pass gate transistor PG-1. Furthermore, the source of the pull-up transistor PU-2 is coupled to the positive power supply node Vdd, and the source of the pull-down transistor PD-2 is coupled to the ground Vss.

Figure 3:
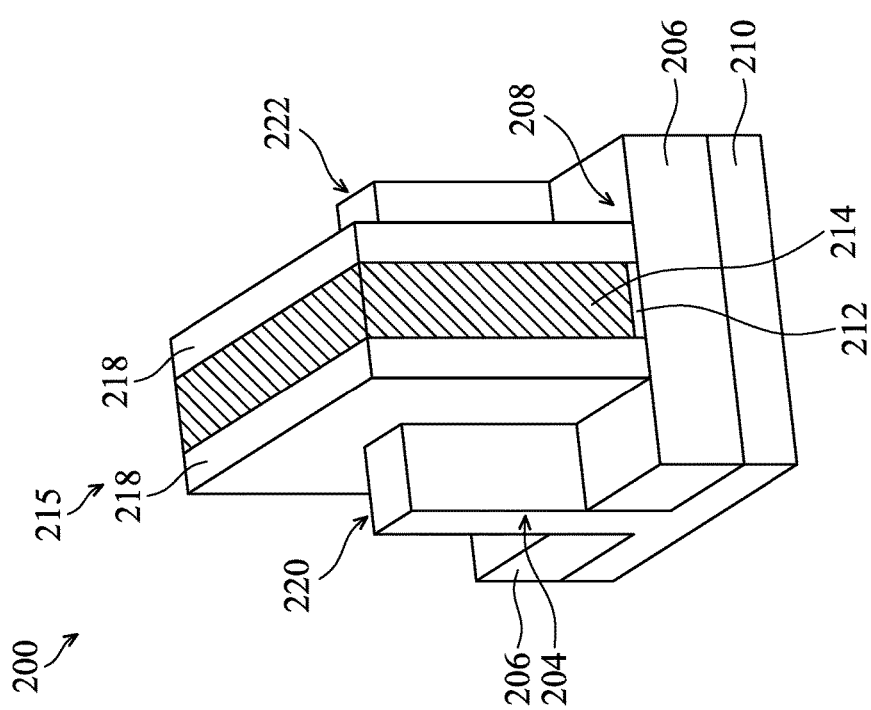
FIG. 3 illustrates a perspective view of a fin field effect transistor (FinFET), in accordance with some embodiments of the disclosure.

FIG. 3 illustrates a perspective view of a fin field effect transistor (FinFET) 200, in accordance with some embodiments of the disclosure. The FinFET 200 may serve as any of the transistors in the SRAM cell 10, including the pull-up transistors PU-1 and PU-2, the pull-down transistors PD-1 and PD-2, and the pass-gate transistors PG-1 and PG-2. In some embodiments, the FinFET 200 includes a semiconductor fin 204, a gate structure 215, the spacers 218, a drain region 220 and a source region 222. The semiconductor fin 204 extends above a semiconductor substrate 210. In some embodiments, the FinFET 200 includes multiple semiconductor fins 204. In some embodiments, the semiconductor substrate 210 and the semiconductor fin 204 are made of the same material. For example, the semiconductor substrate 210 is a silicon substrate. In some instances, the semiconductor substrate 210 includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the semiconductor substrate 210 is a silicon on insulator (SOI) layer substrate or a silicon on sapphire (SOS) substrate. In some embodiments, the semiconductor substrate 210 and the semiconductor fin 204 are made of different materials.

In some embodiments, the semiconductor fin 204 of the FinFET 200 may be surrounded by an isolating features 206 formed on opposite sides of the semiconductor fin 204. The isolating features 206 may electrically isolate an active region (not shown) of the FinFET 200 from other active regions. In some embodiments, the isolating features 206 are shallow trench isolation (STI), field oxide (FOX), or another suitable electrically insulating structure.

In some embodiments, the gate structure 215, which includes a gate dielectric 212 and a gate electrode 214 formed over the gate dielectric 212, is positioned over sidewalls and a top surface of the semiconductor fin 204. Therefore, a portion of the semiconductor fin 204 overlaps the gate structure 215 may serve as a channel region of the FinFET 200. In some embodiments, the channel region of p-type FinFETs, for example, the pull-up transistors PU-1 and PU-2, includes a SiGe channel region. In some embodiments, the gate dielectric 212 is a high dielectric constant (high-k) dielectric material. In some embodiments, the gate electrode 214 is made of a conductive material, such as aluminum (Al), copper (Cu), tungsten (W), titanium (Ti), tantalum (Ta), or another applicable material.

In some embodiments, the spacers 218 of the FinFET 200 are positioned over sidewalls and a top surface of the semiconductor fin 204. In addition, the spacers 218 may be formed on opposite sides of the gate structure 215. In some embodiments, the spacers 218 are made of silicon nitride, silicon oxynitride, silicon carbide, another suitable material, or a combination thereof.

In some embodiments, portions of the semiconductor fin 204 that are not covered by the gate structure 215 and the spacers 218 serve as a drain region 220 and a source region 222. In some embodiments, the drain region 220 and the source region 222 of p-type FinFETs (e.g., the pull-up transistors PU-1 and PU-2) are formed by implanting the portions of the semiconductor fin 204 that are not covered by the gate structure 215 and the spacers 218 with a p-type impurity, such as boron, indium, or the like. In some embodiments, the drain region 220 and the source region 222 of n-type FinFETs (e.g., the pull-down transistors PD-1 and PD-2, and the pass-gate transistors PG-1 and PG-2) are formed by implanting the portions of the semiconductor fin 204 that are not covered by the gate structure 215 and the spacers 218 with an n-type impurity such as phosphorous, arsenic, antimony, or the like.

In some other embodiments, the pass-gate transistors PG-1 and PG-2, the pull-up transistors PU-1 and PU-2, and the pull-down transistors PD-1 and PD-2 of the SRAM cell 10 are planar MOS devices.

Figure 4:
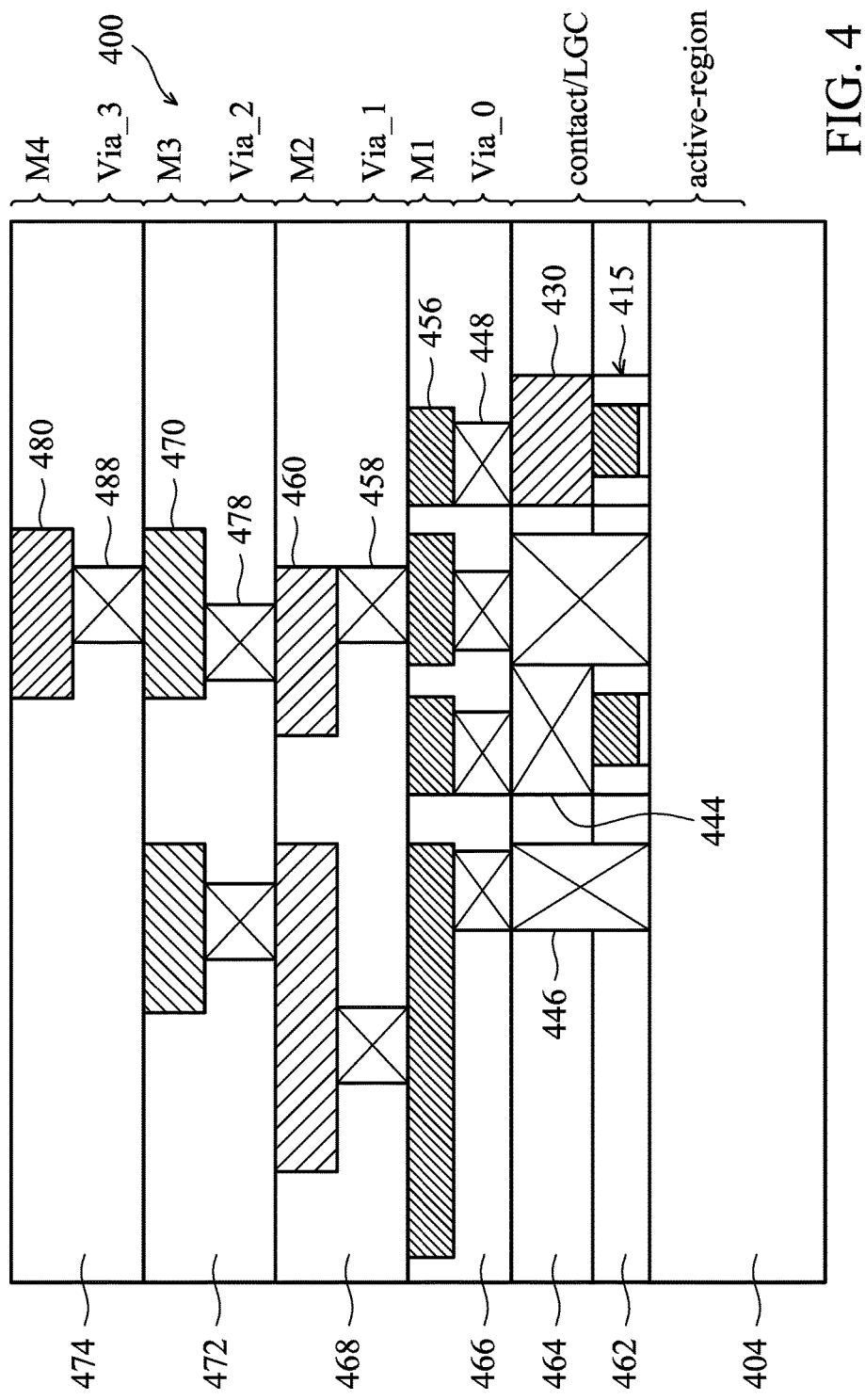
FIG. 4 shows a schematic cross-sectional view of multiple layers involved in the SRAM cell, in accordance with some embodiments of the disclosure.

FIG. 4 shows a schematic cross-sectional view of multiple layers involved in the SRAM cell 10, in accordance with some embodiments of the disclosure. The layers of FIG. 4 are formed on a semiconductor chip or a wafer. Furthermore, FIG. 4 is schematically illustrated to show various levels of an interconnect structure 400 and transistors, and may not reflect the actual cross-sectional view of SRAM cell 10. The interconnect structure 400 may include an active-region level (labeled as "active-region" in FIG. 4), a contact/LGC (local gate connection) level (labeled as "contact/LGC" in FIG. 4), multiple via levels (labeled as "Via_0" and "Via_1" in FIG. 4), and multiple metal-layer levels (labeled as "M1" and "M2" in FIG. 4). Each of the levels and layers includes one or more dielectric layers and the conductive features formed therein. The conductive features that are at the same level may have top surfaces that are substantially level with each other and bottom surfaces that are substantially level with each other. The conductive features that are at the same level may be formed simultaneously.

In some embodiments, the active-region level may include a semiconductor fin 404 (or a semiconductor substrate) formed therein. The contact/LGC (local gate connection) level may include transistors 415, contacts (or called butted contact plugs) 446, gate contacts 444 and conductive line patterns 430 formed in dielectric layers 462 and 464. In addition, the dielectric layers 462 and 464 may serve as inter-layer dielectric (ILD) layers. The Via_0 level may include vias 448, and the M1 level may include conductive features 456 (e.g. metal lines). In addition, the vias 448 and the conductive features 456 are formed in a dielectric layer 466. The Via_1 level may include vias 458, and the M2 level may include conductive features 460 (e.g. metal lines). In addition, the vias 458 and the conductive features 460 are formed in a dielectric layer 468. The Via_2 level may include vias 478, and the M3 level may include conductive features 470 (e.g. metal lines). In addition, the vias 478 and the conductive features 470 are formed in a dielectric layer 472. The Via_3 level may include vias 488, and the M4 level may include conductive features 480 (e.g. metal lines). In addition, the vias 488 and the conductive features 480 are formed in a dielectric layer 474. The dielectric layers 466, 468, 472 and 474 may serve as inter-metal dielectric (IMD) layer. Furthermore, the thickness of conductive features 460, 470 and 480 is thicker than that of conductive features 456.

In some embodiments, the contact/LGC (local gate connection) level includes the contacts 446, the gate contacts 444 and the conductive line patterns 430. The gate contacts 444 and the conductive line patterns 430 at the contact/LGC (local gate connection) level may be designed to connect the gate electrode patterns of transistors 415 to an overlying level such as the Via_0 level. In addition, the conductive line patterns 430 at the contact/LGC (local gate connection) level may be designed to connect the gate electrodes of different transistors. The contacts 446 at the contact/LGC (local gate connection) level connects the source regions and drain regions of transistors 415, pickup regions of well regions at the active-region level, and the like to an overlying level such as the Via_0 level.

Figure 5A:
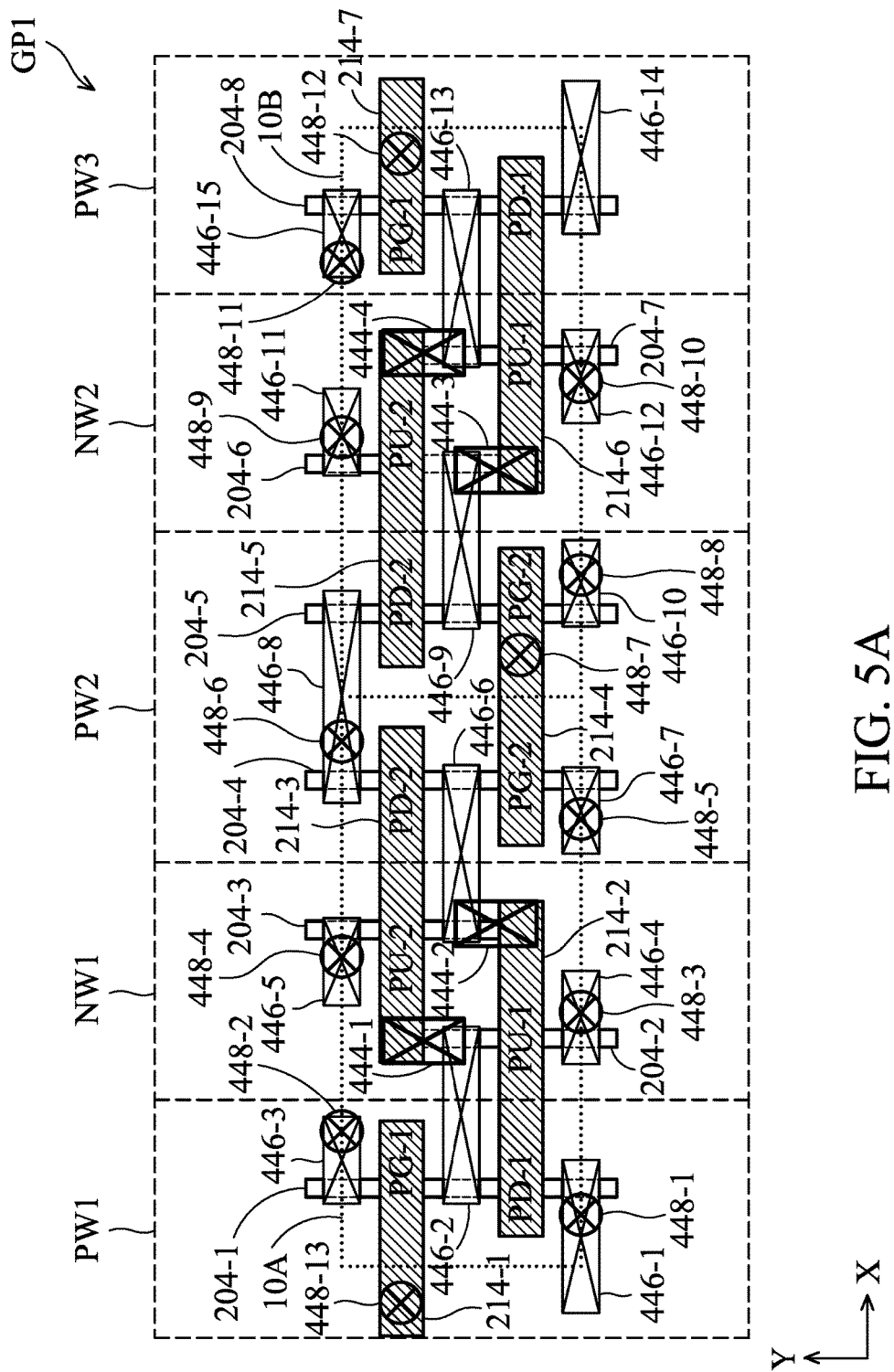
FIG. 5A and FIG. 5B show a layout illustrating a SRAM structure of a first group of the SRAM, in accordance with some embodiments of the disclosure.
Figure 5B:
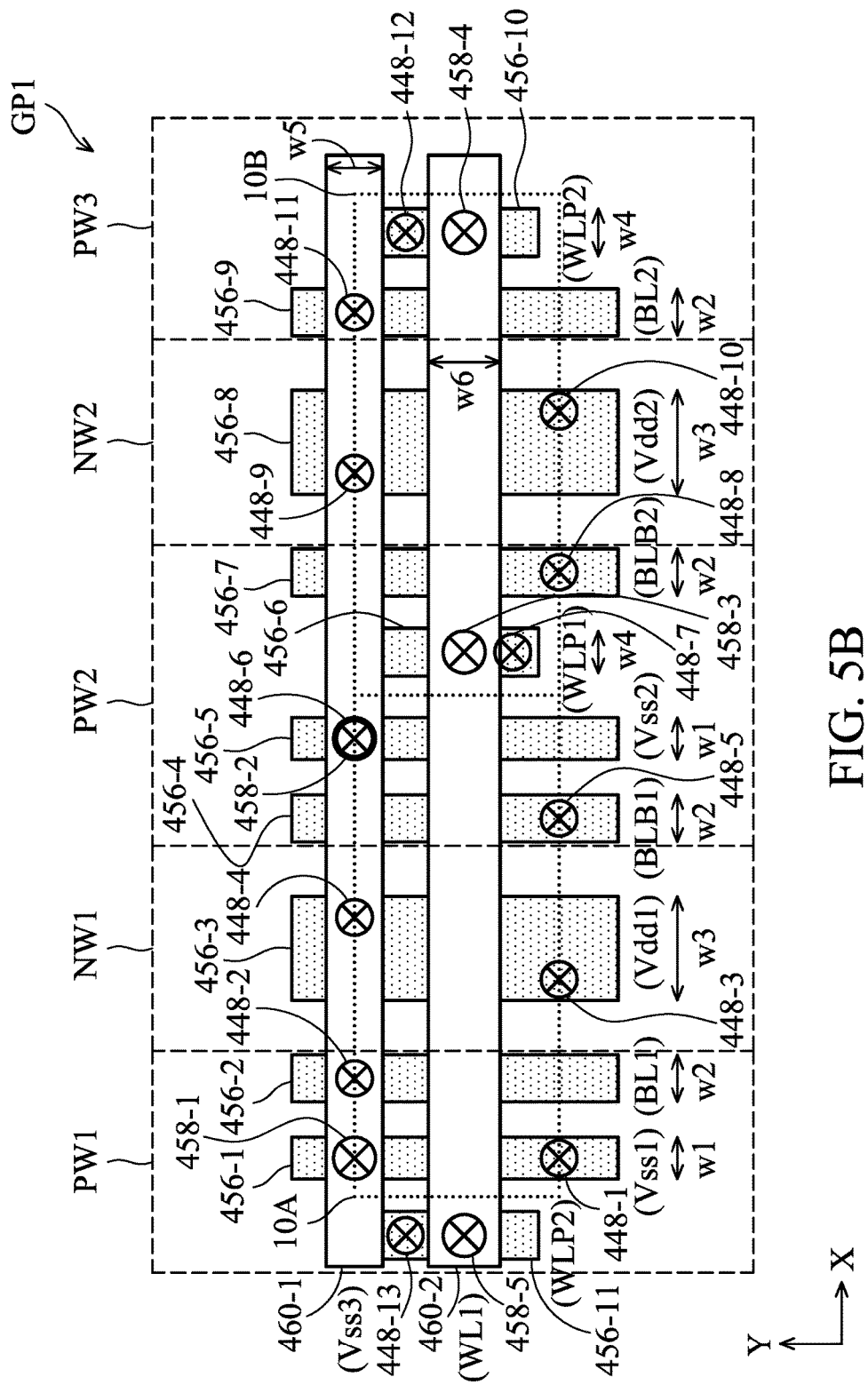

FIG. 5A and FIG. 5B show a layout illustrating a SRAM structure of a first group GP1 of the SRAM 30, in accordance with some embodiments of the disclosure. The first group GP1 includes two adjacent SRAM cells 10A and 10B arranged in the same row of the cell array of the SRAM 30 and a metal routing structure on the two adjacent SRAM cells 10A and 10B. The metal routing structure will be described in detail below.

In some embodiments, the two adjacent SRAM cells 10A and 10B are arranged in mirror symmetry. As described in FIG. 1, an outer boundary of each of the SRAM cells 10A and 10B is illustrated using dashed lines, which mark a rectangular region with an X-pitch and a Y-pitch, and the Y-pitch is shorter than the X-pitch. In some embodiments, the ratio of the X-pitch to the Y-pitch is greater than 2, i.e., X-pitch/Y-pitch >2.

FIG. 5A shows a plan view of an interconnect structure used as the routings of the SRAM cells 10A and 10B of the first group GP1, and the interconnect structure is formed by an arrangement of multiple lower layers (or levels) including wells, fins 204, electrodes 214 (e.g., gate electrode 214 of FIG. 3), contacts 446 and gate contacts 444 of the contact/LGC (local gate connection) level, and vias 448 at the Via_0 level overlying the contact/LGC (local gate connection) level. It should be noted that various levels of the interconnect structure shown in FIG. 5A is merely an example and is not intended to limit the SRAM cells 10A and 10B of the first group GP1.

In the SRAM cell 10A of FIG. 5A, the semiconductor fin 204-1 is configured to serve as the channel regions of the pass-gate transistor PG-1 and the pull-down transistor PD-1. Furthermore, the pass-gate transistor PG-1 and the pull-down transistor PD-1 are formed in a first P-type well region PW1 of a substrate. For the pass-gate transistor PG-1, an electrode 214-1 is configured to electrically connect a gate region of the pass-gate transistor PG-1, and the contacts 446-2 and 446-3 are configured to electrically connect the drain and source regions of the pass-gate transistor PG-1, respectively. For the pull-down transistor PD-1, an electrode 214-2 is configured to electrically connect a gate region of the pull-down transistor PD-1, and the contacts 446-2 and 446-1 are configured to electrically connect the drain and source regions of the pull-down transistor PD-1, respectively.

In the SRAM cell 10A of FIG. 5A, the semiconductor fin 204-2 is configured to serve as the channel region of the pull-up transistor PU-1. Furthermore, the pull-up transistor PU-1 is formed in a first N-type well region NW1 of the substrate. For the pull-up transistor PU-1, the electrode 214-2 is configured to electrically connect a gate region of the pull-up transistor PU-1, and the contact 446-2 and 446-4 are configured to electrically connect the drain and source regions of the pull-up transistor PU-1, respectively. As described above, the electrode 214-2 is also electrically coupled to the gate region of the pull-down transistor PD-1, and the contact 446-2 is also electrically coupled to the drain regions of the pull-down transistor PD-1 and the pass-gate transistor PG-1.

In the SRAM cell 10A of FIG. 5A, the semiconductor fin 204-3 is configured to serve as the channel region of the pull-up transistor PU-2. Furthermore, the pull-up transistor PU-2 is formed in the first N-type well region NW1 of the substrate. For the pull-up transistor PU-2, the electrode 214-3 is configured to electrically connect a gate region of the pull-up transistor PU-2, and the contact 446-6 and 446-5 are configured to electrically connect the drain and source regions of the pull-up transistor PU-2, respectively. Furthermore, the electrode 214-3 is configured to electrically connect the contact 446-2 through a gate contact 444-1, thus the gate region of the pull-up transistor PU-2 is electrically coupled to the drain regions of the pull-up transistor PU-1, the pull-down transistor PD-1, and the pass-gate transistor PG-1.

In the SRAM cell 10A of FIG. 5A, the semiconductor fin 204-4 is configured to serve as the channel regions of the pass-gate transistor PG-2 and the pull-down transistor PD-2. Furthermore, the pass-gate transistor PG-2 and the pull-down transistor PD-2 are formed in a second P-type well region PW2 of the substrate. In some embodiments, the first N-type well region NW1 is positioned between the first P-type well region PW1 and the second P-type well region PW2. For the pass-gate transistor PG-2, an electrode 214-4 is configured to electrically connect a gate region of the pass-gate transistor PG-2, and the contacts 446-6 and 446-7 are configured to electrically connect the drain and source regions of the pass-gate transistor PG-2, respectively. For the pull-down transistor PD-2, the electrode 214-3 is configured to electrically connect a gate region of the pull-down transistor PD-2, and the contacts 446-6 and 446-8 are configured to electrically connect the drain and source regions of the pull-down transistor PD-2, respectively. As described above, the electrode 214-3 is also electrically coupled to the gate region of the pull-up transistor PU-2, thus the gate region of the pull-down transistor PD-2 is also electrically coupled to the drain regions of the pull-up transistor PU-1, the pull-down transistor PD-1, and the pass-gate transistor PG-1. Moreover, the contact 446-6 is electrically coupled to the drain region of the pull-up transistor PU-2 and to the electrode 214-2 through the gate contact 444-2, thus the drain regions of the pull-down transistor PD-2 and the pass-gate transistor PG-2 are also electrically coupled to the drain region of the pull-up transistor PU-2, and the gate regions of the pull-up transistor PU-1 and the pull-down transistor PD-1.

In the SRAM cell 10A, the first N-type well region NW1 is arranged at the middle of the SRAM cell 10A, and the first and second P-type well regions PW1 and PW2 are arranged on opposite sides of the first N-type well region NW1.

In the SRAM cell 10B of FIG. 5A, the semiconductor fin 204-8 is configured to serve as the channel regions of the pass-gate transistor PG-1 and the pull-down transistor PD-1. Furthermore, the pass-gate transistor PG-1 and the pull-down transistor PD-1 are formed in a third P-type well region PW3 of the substrate. For the pass-gate transistor PG-1, an electrode 214-7 is configured to electrically connect a gate region of the pass-gate transistor PG-1, and the contacts 446-13 and 446-15 are configured to electrically connect the drain and source regions of the pass-gate transistor PG-1, respectively. For the pull-down transistor PD-1, an electrode 214-6 is configured to electrically connect a gate region of the pull-down transistor PD-1, and the contacts 446-13 and 446-14 are configured to electrically connect the drain and source regions of the pull-down transistor PD-1, respectively.

In the SRAM cell 10B of FIG. 5A, the semiconductor fin 204-7 is configured to serve as the channel region of the pull-up transistor PU-1. Furthermore, the pull-up transistor PU-1 is formed in a second N-type well region NW2 of the substrate. For the pull-up transistor PU-1, the electrode 214-6 is configured to electrically connect a gate region of the pull-up transistor PU-1, and the contact 446-13 and 446-12 are configured to electrically connect the drain and source regions of the pull-up transistor PU-1, respectively. As described above, the electrode 214-6 is also electrically coupled to the gate region of the pull-down transistor PD-1, and the contact 446-13 is also electrically coupled to the drain regions of the pull-down transistor PD-1 and the pass-gate transistor PG-1.

In the SRAM cell 10B of FIG. 5A, the semiconductor fin 204-6 is configured to serve as the channel region of the pull-up transistor PU-2. Furthermore, the pull-up transistor PU-2 is formed in the second N-type well region NW2 of the substrate. For the pull-up transistor PU-2, the electrode 214-5 is configured to electrically connect a gate region of the pull-up transistor PU-2, and the contact 446-9 and 446-11 are configured to electrically connect the drain and source regions of the pull-up transistor PU-2, respectively. Furthermore, the electrode 214-5 is configured to electrically connect the contact 446-13 through a gate contact 444-4, thus the gate region of the pull-up transistor PU-2 is electrically coupled to the drain regions of the pull-up transistor PU-1, the pull-down transistor PD-1, and the pass-gate transistor PG-1.

In the SRAM cell 10B of FIG. 5A, the semiconductor fin 204-5 is configured to serve as the channel regions of the pass-gate transistor PG-2 and the pull-down transistor PD-2. Furthermore, the pass-gate transistor PG-2 and the pull-down transistor PD-2 are formed in the second P-type well region PW2 of the substrate. In some embodiments, the second N-type well region NW2 is positioned between the second P-type well region PW2 and the third P-type well region PW3. For the pass-gate transistor PG-2, the electrode 214-4 is configured to electrically connect a gate region of the pass-gate transistor PG-2, and the contacts 446-9 and 446-10 are configured to electrically connect the drain and source regions of the pass-gate transistor PG-2, respectively. For the pull-down transistor PD-2, the electrode 214-5 is configured to electrically connect a gate region of the pull-down transistor PD-2, and the contacts 446-9 and 446-8 are configured to electrically connect the drain and source regions of the pull-down transistor PD-2, respectively. As described above, the electrode 214-5 is also electrically coupled to the gate region of the pull-up transistor PU-2, thus the gate region of the pull-down transistor PD-2 is also electrically coupled to the drain regions of the pull-up transistor PU-1, the pull-down transistor PD-1, and the pass-gate transistor PG-1. Moreover, the contact 446-9 is electrically coupled to the drain region of the pull-up transistor PU-2 and to the electrode 214-6 through the gate contact 444-3, thus the drain regions of the pull-down transistor PD-2 and the pass-gate transistor PG-2 are also electrically coupled to the drain region of the pull-up transistor PU-2, and the gate regions of the pull-up transistor PU-1 and the pull-down transistor PD-1.

In the group GP1 of FIG. 5A, the source regions of the pull-down transistors PD-2 of the SRAM cells 10A and 10B are coupled together through the contact 446-8. Furthermore, the gate regions of the pass-gate transistors PG-2 of the SRAM cells 10A and 10B are coupled together through the electrode 214-4.

In the SRAM cell 10B, the second N-type well region NW2 is arranged at the middle of the SRAM cell 10B, and the second and third P-type well regions PW2 and PW3 are arranged on opposite sides of the second N-type well region NW2. Furthermore, the second P-type well region PW2 is shared by the SRAM cells 10A and 10B.

FIG. 5B shows a plan view of an interconnect structure used as the routings of the SRAM cells 10A and 10B of the first group GP1, and the interconnect structure is formed by an arrangement of multiple higher layers (or levels) including vias 448 at the Via_0 level overlying the contact/LGC (local gate connection) level, metal lines 456 in the M1 level overlying the Via_0 level, vias 458 at the Via_1 level overlying the M1 level, and metal lines 460 in the M2 level overlying the Via_1 level. It should be noted that various levels of the interconnect structure shown in FIG. 5B is merely an example and is not intended to be limiting the actual cross-sectional view of SRAM cells 10A and 10B of the first group GP1.

In the first group GP1 of FIG. 5B, the metal lines 456-1 to 456-10 are formed in a first metallization layer (e.g. the M1 level), and extend parallel to a Y-direction. Furthermore, the metal lines 456-1 to 456-10 are arranged in the first metallization layer in sequence.

Referring to FIGS. 5A and 5B together, the metal line 456-1 is configured to serve as a first Vss line Vss1. The first Vss line VSS1 is electrically coupled to the source region of the pull-down transistor PD-1 of the SRAM cell 10A through the via 448-1 and the contact 446-1. The width of the first Vss line Vss1 is w1.

The metal line 456-2 is positioned between the metal lines 456-1 and 456-3. The metal line 456-2 is configured to serve as a first bit line BL1. The first bit line BL1 is electrically coupled to the source region of the pass-gate transistor PG-1 of the SRAM cell 10A through the via 448-2 and the contact 446-3. The width of the first bit line BL1 is w2, and the first bit line BL1 is wider than the first Vss line Vss1, e.g., w2>w1. In some embodiments, the first bit line BL1 has wider width (>10%) than the first Vss line Vss1.

The metal line 456-3 is positioned between the metal lines 456-2 and 456-4. The metal line 456-3 is configured to serve as a first power supply line Vdd1. The first power supply line Vdd1 is electrically coupled to the source region of the pull-up transistor PU-1 of the SRAM cell 10A through the via 448-3 and the contact 446-4. Furthermore, the first power supply line Vdd1 is also electrically coupled to the source region of the pull-up transistor PU-2 of the SRAM cell 10A through the via 448-4 and the contact 446-5. The width of the first power supply line Vdd1 is w3, and the first power supply line Vdd1 is wider than the first bit line BL1, e.g., w3>w2. In some embodiments, the first power supply line Vdd has wider width (>10%) than the first bit line BL1.

The metal line 456-4 is positioned between the metal lines 456-3 and 456-5. The metal line 456-4 is configured to serve as a first complementary bit line BLB1. The first complementary bit line BLB1 is electrically coupled to the source region of the pass-gate transistor PG-2 of the SRAM cell 10A through the via 448-5 and the contact 446-7. The width of the first complementary bit line BLB1 is w2.

The metal line 456-6 is positioned between the metal lines 456-5 and 456-7. The metal line 456-6 is configured to serve as a first word-line landing pad WLP1. The first word-line landing pad WLP1 is electrically coupled to the gate region of the pass-gate transistor PG-2 of the SRAM cell 10A through the via 448-7. The width of the first word-line landing pad WLP1 is w4. In some embodiments, the widths of the first word-line landing pad WLP1 and the first bit line BL1 are the same, e.g., w4=w2. As described above, the gate regions of the pass-gate transistor PG-2 of the SRAM cell 10A and the pass-gate transistor PG-2 of the SRAM cell 10B are coupled together through the electrode 214-4. Thus, the first word-line landing pad WLP1 is also electrically coupled to the gate region of the pass-gate transistor PG-2 of the SRAM cell 10B through the via 448-7. Furthermore, the first word-line landing pad WLP1 is positioned within the SRAM cell 10B without touching or overlaying the cell boundary of the SRAM cell 10B, i.e., the first word-line landing pad WLP1 does not exceed the SRAM cell 10B.

The metal line 456-7 is positioned between the metal lines 456-6 and 456-8. The metal line 456-7 is configured to serve as a second complementary bit line BLB2. The second complementary bit line BLB2 is electrically coupled to the source region of the pass-gate transistor PG-2 of the SRAM cell 10B through the via 448-8 and the contact 446-10. The width of the second bit complementary line BLB2 is w2. In some embodiments, the widths of the first and second bit complementary lines BLB1 and BLB2 are different.

The metal line 456-8 is positioned between the metal lines 456-7 and 456-9. The metal line 456-8 is configured to serve as a second power supply line Vdd2. The second power supply line Vdd2 is electrically coupled to the source region of the pull-up transistor PU-1 of the SRAM cell 10B through the via 448-10 and the contact 446-12. Furthermore, the second power supply line Vdd2 is also electrically coupled to the source region of the pull-up transistor PU-2 of the SRAM cell 10B through the via 448-9 and the contact 446-11. The width of the second power supply line Vdd2 is w3. In some embodiments, the widths of the first and second power supply lines Vdd1 and Vdd2 are different.

The metal line 456-9 is positioned between the metal lines 456-8 and 456-10. The metal line 456-9 is configured to serve as a second bit line BL2. The second bit line BL2 is electrically coupled to the source region of the pass-gate transistor PG-1 of the SRAM cell 10B through the via 448-11 and the contact 446-15. The width of the second bit line BL2 is w2. In some embodiments, the widths of the first and second bit lines BL1 and BL2 are different.

The metal line 456-10 is configured to serve as a second word-line landing pad WLP2. The second word-line landing pad WLP2 is electrically coupled to the gate region of the pass-gate transistor PG-2 of the SRAM cell 10B through the via 448-12. The width of the second word-line landing pad WLP1 is w4. In some embodiments, the widths of the first and second word-line landing pads WLP1 and WLP2 are different. Furthermore, the second word-line landing pad WLP2 is also positioned within the SRAM cell 10B without touching or overlaying the cell boundary of the SRAM cell 10B, i.e., the first word-line landing pad WLP2 does not exceed the SRAM cell 10B.

The metal lines 460-1 and 460-2 are formed in a second metallization layer (e.g. the M2 level), and extend parallel to an X-direction, and the X-direction is perpendicular to the Y-direction. Furthermore, thickness of the metal lines 460-1 and 460-2 is thicker than that of the metal lines 456-1 to 456-10.

The metal line 460-1 is configured to serve as a third Vss line Vss3. The third Vss line Vss3 is electrically coupled to the first Vss line Vss1 through the via 458-1 and to the second Vss line Vss2 through the via 458-2. The width of the third Vss line Vss3 is w5.

The metal line 460-2 is configured to serve as a first word line WL1. The first word line WL1 is electrically coupled to the first word-line landing pad WLP1 through the via 458-3 and to the second word-line landing pad WLP2 through the via 458-4. The width of the first word line WL1 is w6, and the first word line WL1 is wider than the third Vss line Vss3, e.g., w6>w5.

In some embodiments, the layouts of the groups GP in the same row of the SRAM 30 are the same. For example, the first group GP1, a left group (not shown) on the left side of the first group GP1 and a right group (not shown) on the right side of the first group GP1 all have the same structure in layout. Specifically, the arrangement of the of multiple layers of the SRAM cells 10A and 10B of the first group GP1, the left group and the right group are the same. Thus, the first word line WL1 is also electrically coupled to the second word-line landing pad WLP2 of the SRAM cell 10B of the left group through the via 458-5, thus the first word line WL1 is electrically coupled to the electrode 214-1 through the via 458-5, the second word-line landing pad WLP2, and the via 448-13 positioned in the SRAM cell 10B of the left group. Similarly, the first word line WL1 is electrically coupled to the electrode 214-7 through the via 458-4, the second word-line landing pad WLP2, and the via 448-12 positioned in the SRAM cell 10B of the first group GP1, and the electrode 214-7 is coupled to the pass-gate transistor PG-1 (not shown) of the SRAM 10A of the right group.

In the first group GP1, the source region of the pull-down transistor PD-1 of the SRAM cell 10B is electrically coupled to the first Vss line Vss1 (not shown) of the right group through the contact 446-14.

Figure 6:
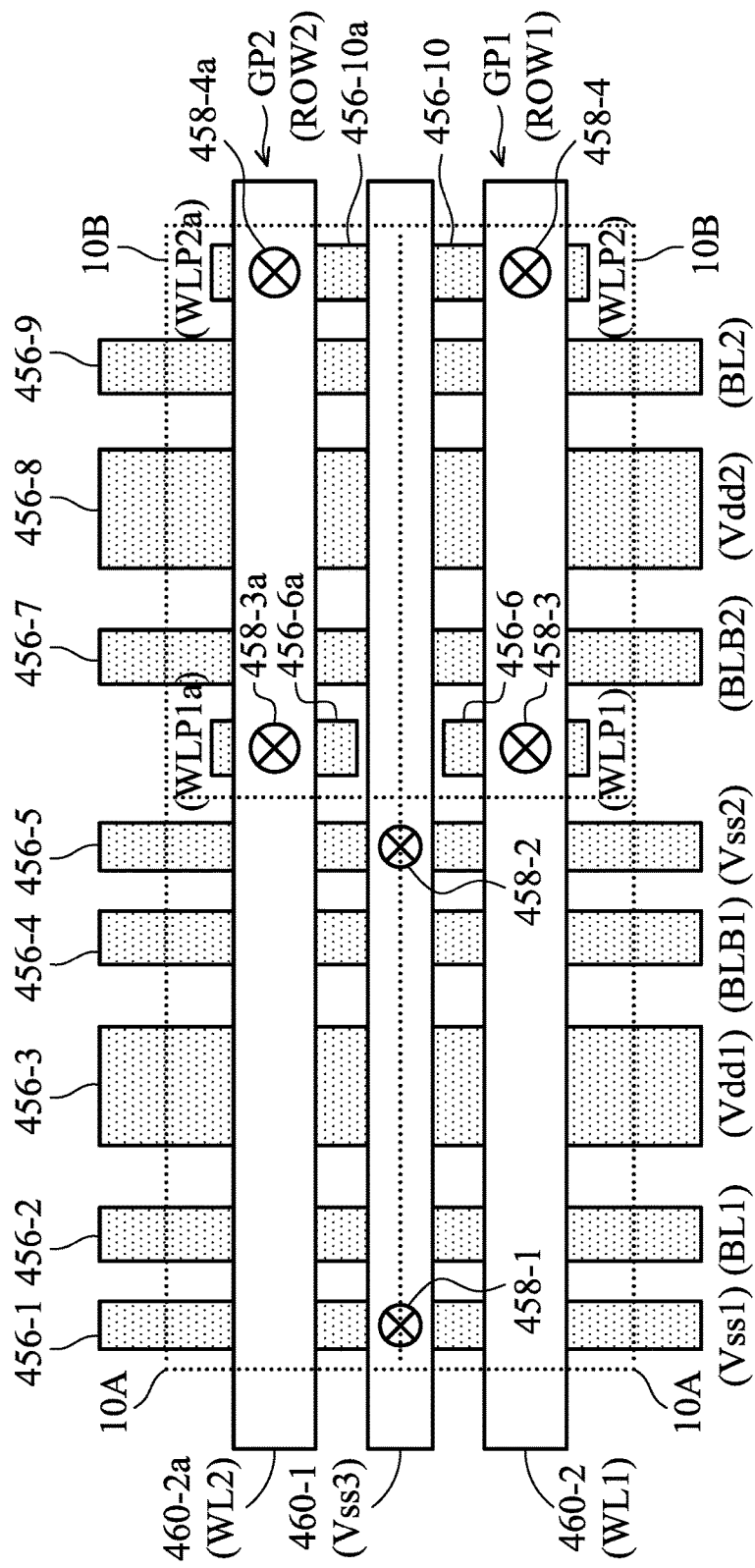
FIG. 6 shows a layout illustrating a SRAM structure of the first and second groups of the SRAM of FIGS. 5A and 5B, in accordance with some embodiments of the disclosure.

FIG. 6 shows a layout illustrating a SRAM structure of the first and second groups GP1 and GP2 of the SRAM 30 of FIGS. 5A and 5B, in accordance with some embodiments of the disclosure. In the SRAM 30, the first group GP1 includes two adjacent SRAM cells 10A and 10B arranged in the row ROW1 of the cell array, and the second group GP2 includes two adjacent SRAM cells 10A and 10B arranged in the row ROW2 of the cell array. In some embodiments, the SRAM cell 10 arranged in the same column of the cell array have the same structure in layout. For example, the SRAM cell 10A of the first group GP1 and the SRAM cell 10A of the second group GP2 have the same structure in layout, and the SRAM cell 10B of the first group GP1 and the SRAM cell 10B of the second group GP2 have the same structure in layout.

In FIG. 6, a plan view of an interconnect structure used as the routings of the SRAM cells 10A and 10B of the first and second groups GP1 and GP2 is used as an example, and the interconnect structure is formed by an arrangement of metal lines 456 in the M1 level overlying the Via_0 level, vias 458 at the Via_1 level overlying the M1 level, and metal lines 460 in the M2 level overlying the Via_1 level. It should be noted that various levels of the interconnect structure shown in FIG. 6 is merely an example and is not intended to be limiting the actual cross-sectional view of SRAM cells 10A and 10B of the first group GP1 and the second group GP2.

In FIG. 6, the first Vss line Vss1, the first bit line BL1, the first power supply line Vdd1, the first complementary bit line BLB1, the second Vss line Vss2, the second complementary bit line BLB2, the second power supply line Vdd2 and the second bit line BL2 are shared by the first group GP1 and the second group GP2 in the first metallization layer.

In the first group GP1 of FIG. 6, the first word-line landing pad WLP1 and the second word-line landing pad WLP2 are both positioned within the SRAM cell 10B of the first group GP1. Furthermore, the first word-line landing pad WLP1 and the second word-line landing pad WLP2 are electrically coupled to the first word line WL1 (i.e., the metal line 460-2) through the vias 458-3 and 458-4, respectively.

In the second group GP2 of FIG. 6, the first word-line landing pad WLP1*a* and the second word-line landing pad WLP2*a* are both positioned within the SRAM cell 10B of the second group GP2. Furthermore, the first word-line landing pad WLP1*a* and the second word-line landing pad WLP2*a* are electrically coupled to the second word line WL2 (i.e., the metal line 460-2*a*) through the vias 458-3*a* and 458-4*a*, respectively.

The third Vss line Vss3 is shared by the first group GP1 and the second group GP2 in the second metallization layer. The third Vss line Vss3 is electrically coupled to the first Vss line Vss1 and the second Vss line Vss2 through the vias 458-1 and 458-2, respectively. Furthermore, the third Vss line Vss3 is positioned between the first word line WL1 and the second word line WL2. In some embodiments, the widths of the first word line WL1 and the second word line WL2 are the same.

Figure 7:
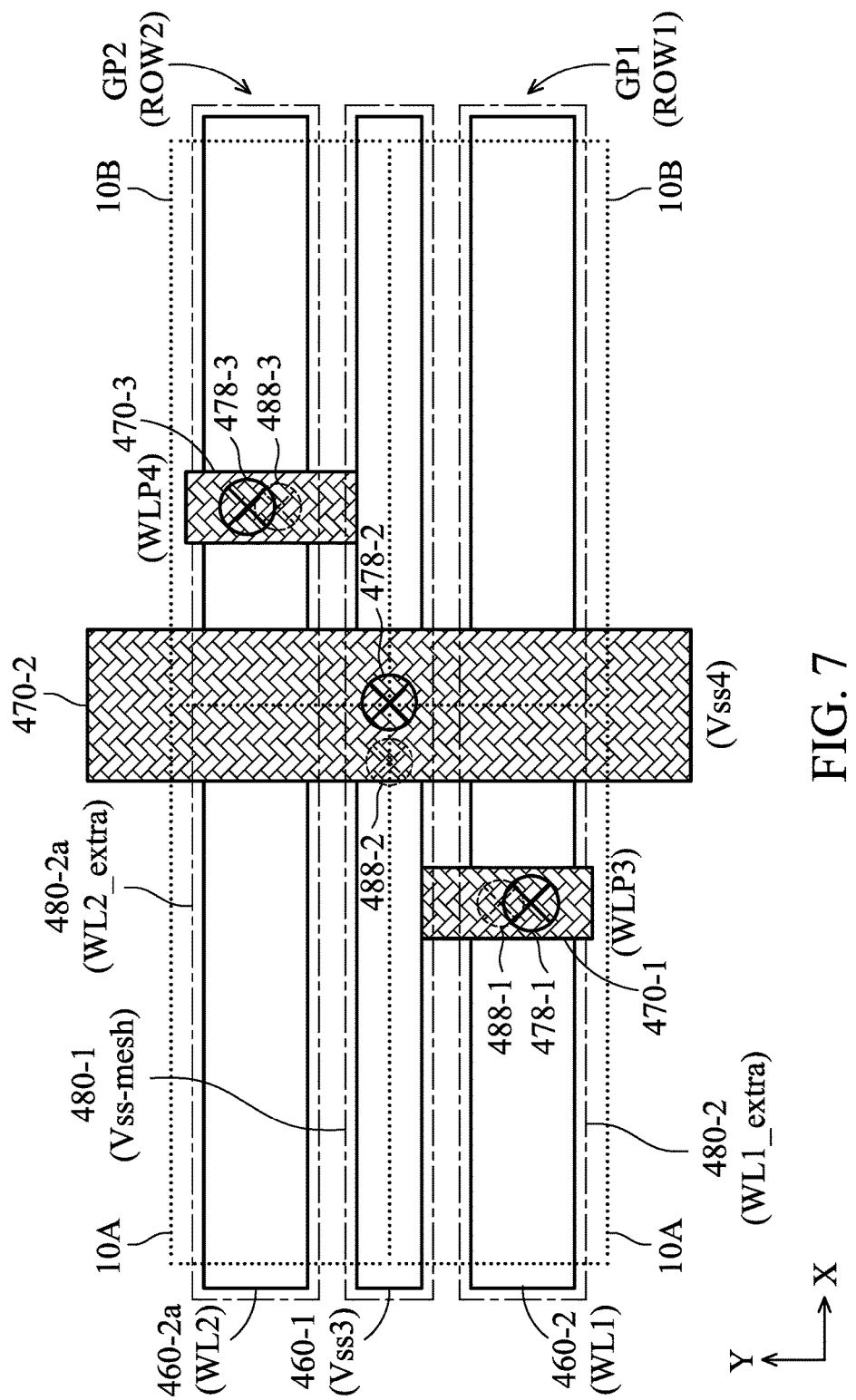
FIG. 7 shows a plan view of an interconnect structure used as the routings of the first and second groups of FIG. 6.

FIG. 7 shows a plan view of an interconnect structure used as the routings of the first and second groups GP1 and GP2 of FIG. 6, and the interconnect structure is formed by an arrangement of multiple higher layers (or levels) including metal lines 460 in the M2 level overlying the Via_1 level, vias 478 at the Via_1 level overlying the M2 level, metal lines 470 in the M3 level overlying the Via_2 level, vias 488 at the Via_3 level overlying the M3 level, and metal lines 480 in the M4 level overlying the Via_3 level.

In FIG. 7, the metal lines 470-1 to 470-3 are formed in a third metallization layer (e.g. the M3 level), and extend parallel to a Y-direction. Furthermore, the metal lines 470-1 to 470-3 are arranged in the third metallization layer in sequence.

The metal line 470-1 is configured to serve as a third word-line landing pad WLP3. The third word-line landing pad WLP3 is electrically coupled to the first word line WL1 through the via 478-1. The metal line 470-2 is configured to serve as a fourth Vss line Vss4. The fourth Vss line Vss4 is electrically coupled to the third Vss line Vss3 through the via 478-2. The metal line 470-3 is configured to serve as a fourth word-line landing pad WLP4. The fourth word-line landing pad WLP4 is electrically coupled to the second word line WL2 through the via 478-3. In some embodiments, the width of the fourth Vss line Vss4 is wider than that of the third and fourth word-line landing pads WLP3 and WLP4.

The metal lines 480-1, 480-2 and 480-2*a* are formed in a fourth metallization layer (e.g. the M4 level), and extend parallel to an X-direction, and the X-direction is perpendicular to the Y-direction.

The metal line 480-1 is configured to serve as a portion of the Vss power mesh Vss-mesh, and the Vss power mesh Vss-mesh is electrically coupled to the fourth Vss line Vss4 through the via 488-2. In some embodiments, the Vss power mesh Vss-mesh is a power grid formed by using a large amount of metal lines for grounding. The metal line 480-2 is configured to serve as an extra first word line WL1_extra. The extra first word line WL1_extra is electrically coupled to the third word-line landing pad WLP3 through the via 488-1. The width of the extra first word line WL1_extra is wider than that of the Vss power mesh Vss-mesh. The metal line 480-2*a* is configured to serve as an extra second word line WL2_extra. The extra second word line WL2_extra is electrically coupled to the fourth word-line landing pad WLP4 through the via 488-3. Furthermore, the Vss power mesh Vss-mesh is positioned between the extra first and the second word lines WL1_extra and WL2_extra.

Figure 8A:
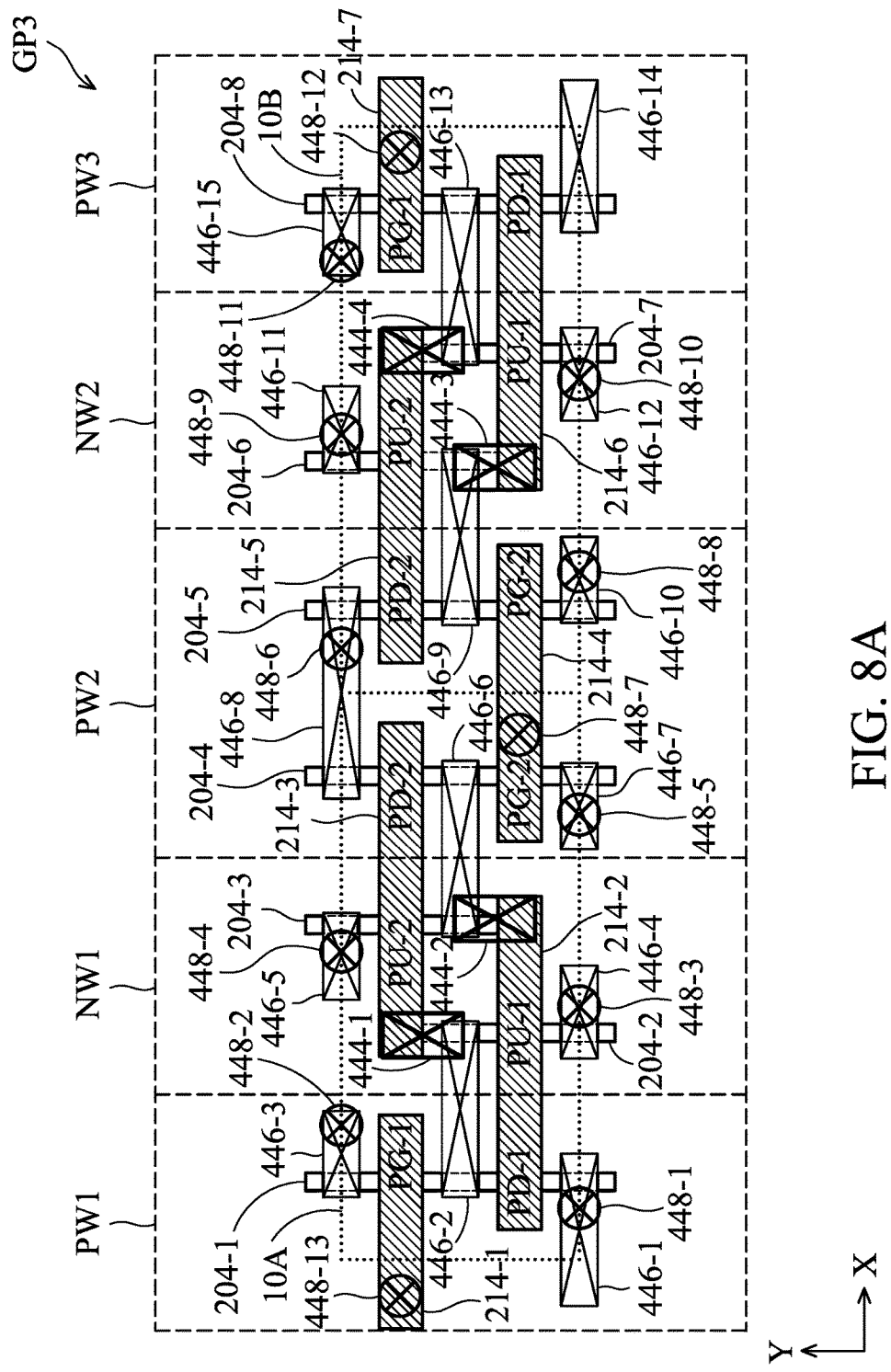
FIG. 8A and FIG. 8B show a layout illustrating a SRAM structure of a third group of the SRAM of FIGS. 8A and 8B, in accordance with some embodiments of the disclosure.
Figure 8B:
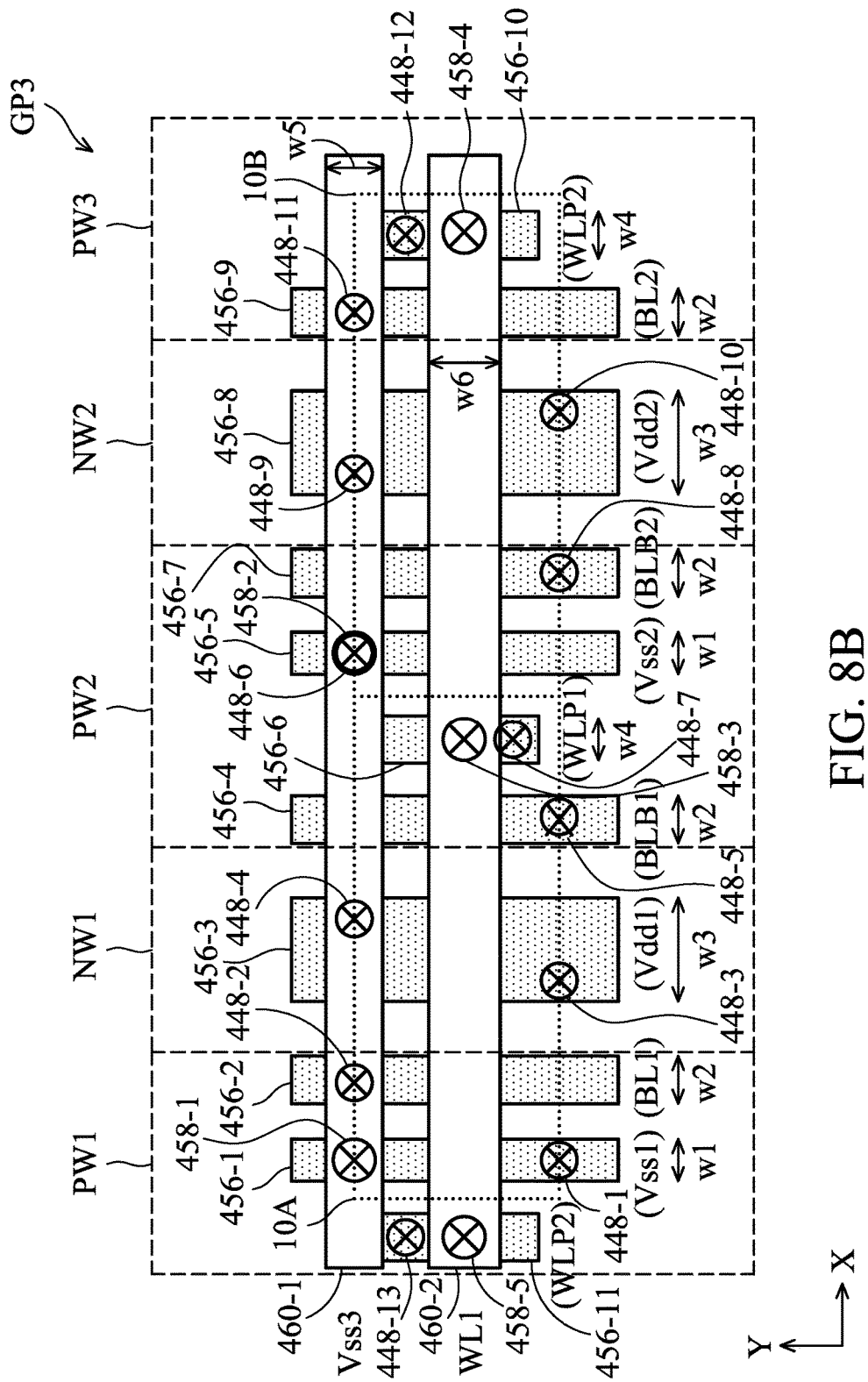

FIG. 8A and FIG. 8B show a layout illustrating a SRAM structure of a third group GP3 of the SRAM 30, in accordance with some embodiments of the disclosure. The third group GP3 includes two adjacent SRAM cells 10A and 10B arranged in the same row of the cell array of the SRAM 30 and a metal routing structure on the two adjacent SRAM cells 10A and 10B. The metal routing structure will be described in detail below.

In some embodiments, the two adjacent SRAM cells 10A and 10B are arranged in mirror symmetry. As described in FIG. 1, an outer boundary of each of the SRAM cells 10A and 10B is illustrated using dashed lines, which mark a rectangular region with an X-pitch and a Y-pitch, and the Y-pitch is shorter than the X-pitch. In some embodiments, the ratio of the X-pitch to the Y-pitch is greater than 2, i.e., X-pitch/Y-pitch >2.

FIG. 8A shows a plan view of an interconnect structure used as the routings of the SRAM cells 10A and 10B of the third group GP3, and the interconnect structure is formed by an arrangement of multiple lower layers (or levels) including wells, fins 204, electrodes 214 (e.g., gate electrode 214 of FIG. 3), contacts 446 and gate contacts 444 of the contact/LGC (local gate connection) level, and vias 448 at the Via_0 level overlying the contact/LGC (local gate connection) level. It should be noted that various levels of the interconnect structure shown in FIG. 8A is merely an example and is not intended to be limiting the actual cross-sectional view of SRAM cells 10A and 10B of the third group GP3.

Compared with the first group GP1 of FIG. 5A, the metal routing structure on the SRAM cells 10A and 10B of the first group GP1 of FIG. 5A and the third group GP3 of FIG. 8A are the same in the fins 204, electrodes 214, contacts 446, gate contacts 444 and vias 448 except for the vias 448-6 and 448-7.

Referring to FIG. 5A and FIG. 8A together, in the first group GP1 of FIG. 5A, the via 448-6 is positioned on the cell boundary of the SRAM cell 10A, i.e. on the left side of the contact 446-8. Furthermore, the via 448-7 is positioned within the SRAM cell 10B, i.e. on the right side of the electrode 214-4.

In the third group GP3 of FIG. 8A, the via 448-6 is positioned on the cell boundary of the SRAM cell 10B, i.e. on the right side of the contact 446-8. Furthermore, the via 448-7 is positioned within the SRAM cell 10A, i.e. on the left side of the electrode 214-4.

FIG. 8B shows a plan view of an interconnect structure used as the routings of the SRAM cells 10A and 10B of the third group GP3, and the interconnect structure is formed by an arrangement of multiple higher layers (or levels) including vias 448 at the Via_0 level overlying the contact/LGC (local gate connection) level, metal lines 456 in the M1 level overlying the Via_0 level, vias 458 at the Via_1 level overlying the M1 level, and metal lines 460 in the M2 level overlying the Via_1 level. It should be noted that various levels of the interconnect structure shown in FIG. 8B is merely an example and is not intended to be limiting the actual cross-sectional view of SRAM cells 10A and 10B of the third group GP3.

Compared with the first group GP1 of FIG. 5B, the positions of the first word-line landing pad WLP1 and the second Vss line are exchanged in the third group GP3 of FIG. 8B. Accordingly, the vias 448-7 and 458-3 corresponding to the first word-line landing pad WLP1 and the vias 448-band 458-2 corresponding to the second Vss line are also changed.

Referring to FIG. 5B and FIG. 8B together, in the first group GP1 of FIG. 5B, the first word-line landing pad WLP1 is positioned within the SRAM cell 10B and between the second Vss line Vss2 and the second complementary bit line BLB2, i.e., the first word-line landing pad WLP1 does not exceed the SRAM cell 10B. Furthermore, the second Vss line Vss2 is positioned within the SRAM cell 10A and between the first word-line landing pad WLP1 and the first complementary bit line BLB1.

In the third group GP3 of FIG. 8B, the first word-line landing pad WLP1 is positioned within the SRAM cell 10A and between the second Vss line Vss2 and the first complementary bit line BLB1, i.e., the first word-line landing pad WLP1 does not exceed the SRAM cell 10A. Furthermore, the second Vss line Vss2 is positioned within the SRAM cell 10B and between the first word-line landing pad WLP1 and the second complementary bit line BLB2.

Figure 9:
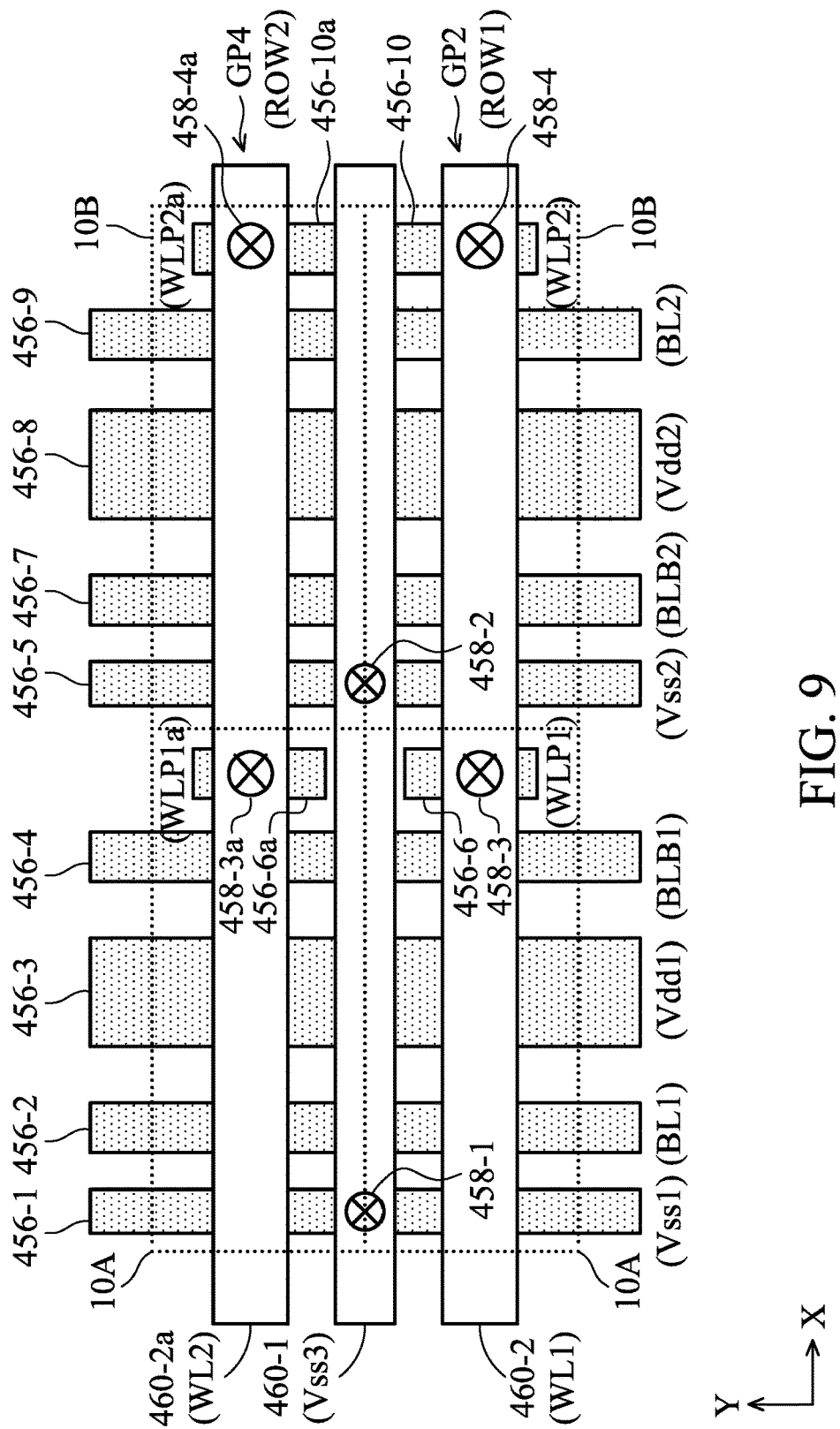
FIG. 9 shows a layout illustrating a SRAM structure of the third and fourth groups of the SRAM of FIGS. 8A and 8B, in accordance with some embodiments of the disclosure.

FIG. 9 shows a layout illustrating a SRAM structure of the third and fourth groups GP3 and GP4 of the SRAM 30 of FIGS. 8A and 8B, in accordance with some embodiments of the disclosure. In the SRAM 30, the third group GP3 includes two adjacent SRAM cells 10A and 10B arranged in the row ROW1 of the cell array, and the fourth group GP4 includes two adjacent SRAM cells 10A and 10B arranged in the row ROW2 of the cell array. In some embodiments, the SRAM cell 10 arranged in the same column of the cell array have the same structure in layout. For example, the SRAM cell 10A of the third group GP3 and the SRAM cell 10A of the fourth group GP4 have the same structure in layout, and the SRAM cell 10B of the second group GP1 and the SRAM cell 10B of the fourth group GP4 have the same structure in layout.

In FIG. 9, a plan view of an interconnect structure used as the routings of the SRAM cells 10A and 10B of the third and fourth group GP3 and GP4 is used as an example, and the interconnect structure is formed by an arrangement of metal lines 456 in the M1 level overlying the Via_0 level, vias 458 at the Via_1 level overlying the M1 level, and metal lines 460 in the M2 level overlying the Via_1 level. It should be noted that various levels of the interconnect structure shown in FIG. 9 is merely an example and is not intended to be limiting the actual cross-sectional view of SRAM cells 10A and 10B of the third group GP3 and the fourth group GP4.

In FIG. 9, the first Vss line Vss1, the first bit line BL1, the first power supply line Vdd1, the first complementary bit line BLB1, the second Vss line Vss2, the second complementary bit line BLB2, the second power supply line Vdd2 and the second bit line BL2 are shared by the third group GP3 and the fourth group GP4 in the first metallization layer.

In the third group GP1 of FIG. 9, the first word-line landing pad WLP1 and the second word-line landing pad WLP2 are positioned within the SRAM cells 10A and 10B of the third group GP3, respectively. Furthermore, the first word-line landing pad WLP1 and the second word-line landing pad WLP2 are electrically coupled to the first word line WL1 (i.e., the metal line 460-2) through the vias 458-3 and 458-4, respectively.

In the fourth group GP4 of FIG. 9, the first word-line landing pad WLP1a and the second word-line landing pad WLP2a are positioned within the SRAM cells 10A and 10B of the fourth group GP4, respectively. Furthermore, the first word-line landing pad WLP1a and the second word-line landing pad WLP2a are electrically coupled to the second word line WL2 (i.e., the metal line 460-2a) through the vias 458-3a and 458-4a, respectively.

The third Vss line Vss3 is shared by the third group GP3 and the fourth group GP4 in the second metallization layer. The third Vss line Vss3 is electrically coupled to the first Vss line Vss1 and the second Vss line Vss2 through the vias 458-1 and 458-2, respectively.

Referring to FIG. 6 and FIG. 9 together, in FIG. 6, the vias 458-1 and 458-2 are both positioned on the cell boundary between the SRAM cells 10A of the first group GP1 and the second group GP2. In FIG. 9, the via 458-1 is positioned on the cell boundary between the SRAM cells 10A of the third group GP3 and the fourth group GP4, and the via 458-2 is positioned on the cell boundary between the SRAM cells 10B of the third group GP3 and the fourth group GP4.

As described above, the higher layers can be used on the interconnect structure. For example, the metal lines 470-1 to 470-3 formed in a third metallization layer (e.g. the M3 level) of FIG. 7 are configured to electrically connect the first word line WL1, the third Vss line Vss3, and the second word line WL2 of FIG. 9, respectively. Furthermore, the metal lines 480-1, 480-2 and 480-2a formed in a fourth metallization layer (e.g. the M4 level) of FIG. 7 are configured to electrically connect the metal lines 470-2, 470-1 and 470-3 of FIG. 9, respectively.

Embodiments for SRAM structures are provided. The two adjacent SRAM cells 10A and 10B of each group GP include two column-base Vss conductors in the first metallization layer, thus providing less IR drop during read cycle of the SRAM 30 for the supply power Vss, and therefore benefit both read speed and cell stability. Fewer metal lines on the SRAM cells 10A and 10B of each group GP can allow for either a wider metal space or a wider metal width for the bit lines BL1 and BL2 and the complementary bit lines BLB1 and BLB2, thereby achieving RC delay reduction in the bit lines BL1 and BL2 and the complementary bit lines BLB1 and BLB2. In the first metallization layer, the two adjacent SRAM cells 10A and 10B of each group GP include two vertical (same routing direction as the bit lines BL1 and BL2) Vss conductors (e.g., Vss1 and Vss2) for power connection. Therefore, the upper metallization layer (e.g. the second metallization layer) and the horizontal direction Vss power mesh conductors can be arranged on one side of the cell boundary of the SRAM cell 10 and be electrically coupled to the vertical direction Vss conductor. Moreover, the half-pitch (shared with the adjacent SRAM cells 10) Vss conductor layout reserves more area to allow for a wider word line WL to lower the resistance (e.g. word line through-rate improvement) of the word line WL. Furthermore, lithography patterning corresponding to the metal routing structure is obtained, so as to allow spacer-lithography implementation and patterning-process margin improvement. Moreover, the metal routing structures of the groups GP can provide lower resistance on the bit lines BL, the Vss lines Vss and the word lines WL for cell performance improvement. Specifically, the metal routing structure can support column base Vss conductors on first metallization layer with fewer metal-track requirements. Furthermore, the Vss line (e.g., Vss2) and the word-line landing pad (e.g. WLP1) can be swapped in the first metallization layer.

In some embodiments, a SRAM structure is provided. The SRAM structure includes multiple SRAM cells arranged in multiple rows and multiple columns, wherein each of the SRAM cells has a rectangular shape with an X-pitch and a Y-pitch which is shorter than the X-pitch, and the ratio of the X-pitch to the Y-pitch is greater than 2. The SRAM cells in the same row are divided into multiple groups, and each of the multiple groups includes: a first SRAM cell and a second SRAM cell adjacent to the first SRAM cell; a first Vss line, a second Vss line, a first word-line landing pad, and a second word-line landing pad formed in a first metallization layer and extend parallel to a first direction; and a third Vss line and a first word line formed in a second metallization layer and extending parallel to a second direction. The first word-line landing pad is positioned within the rectangular shape of the first or second SRAM cell, and the second word-line landing pad is positioned within the rectangular shape of the second SRAM cell. The second metallization layer is positioned on the first metallization layer.

In some embodiments, a SRAM structure is provided. The SRAM structure includes multiple SRAM cells arranged in multiple rows and multiple columns. the SRAM cells in the same row are divided into multiple groups, and each of the multiple groups includes a first SRAM cell and a second SRAM cell adjacent to the first SRAM cell. Each of the multiple groups further includes a first power supply line, a second power supply line, a first Vss line, a second Vss line, a first word-line landing pad, a second word-line landing pad, a first bit line, a first complementary bit line, a second bit line and a second complementary bit line formed in a first metallization layer and extending parallel to a first direction. Moreover, Each of the multiple groups further includes a third Vss line and a first word line formed in a second metallization layer and extending parallel to a second direction perpendicular to the first direction. The second metallization layer is positioned on the first metallization layer. Each of the first and second SRAM cells includes: a first inverter and a second inverter cross-coupled to the first inverter; a first pass-gate transistor electrically coupled to an input terminal of the second inverter and an output terminal of the first inverter; and a second pass-gate transistor electrically coupled to an output terminal of the second inverter and an input terminal of the first inverter. The first word-line landing pad is positioned within the first or second SRAM cell, and the second word-line landing pad is positioned within the second SRAM cell, and the first word line is electrically coupled to gates of the first and second pass-gate transistors of the first and second SRAM cells through the first and second word-line landing pads.

In some embodiments, a SRAM structure is provided. The SRAM structure includes a cell array formed by multiple SRAM cells. The SRAM cells in the same row are divided into multiple groups, and each of the multiple groups includes: a first SRAM cell and a second SRAM cell adjacent to the first SRAM cell; a first power supply line, a first word-line landing pad, a first bit line corresponding to the first SRAM cell, and a first complementary bit line corresponding to the first SRAM cell, a second power supply line, a second word-line landing pad, a second bit line corresponding to the second SRAM cell, and a second complementary bit line corresponding to the second SRAM cell, a first Vss line, and a second Vss line, formed in a first metallization layer and extending parallel to a first direction; and a third Vss line and a first word line formed in a second metallization layer and extending parallel to a second direction perpendicular to the first direction, wherein the second metallization layer is positioned on the first metallization layer, and the first word line is electrically coupled to the first and second word-line landing pads. The first word-line landing pad corresponding to the first SRAM cell is positioned within the first or second SRAM cell, and the second word-line landing pad corresponding to the second SRAM cell is positioned within the second SRAM cell. Widths of the first bit line, the first complementary bit line, the second bit line, and the second complementary bit line are wider than that of the first Vss line and the second Vss line in the first metallization layer. The widths of the first bit line, the first complementary bit line, the second bit line, and the second complementary bit line are narrower than that of the first power supply line and the second power supply line.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Static Random Access Memory (SRAM) structure, comprising:
a plurality of SRAM cells arranged in a plurality of rows and a plurality of columns, wherein each of the SRAM cells has a rectangular shape with an X-pitch and a Y-pitch which is shorter than the X-pitch, and a ratio of the X-pitch to the Y-pitch is greater than 2,
wherein the SRAM cells in the same row are divided into a plurality of groups, and each of the plurality of groups comprises:
a first SRAM cell and a second SRAM cell adjacent to the first SRAM cell;
a first Vss line, a second Vss line, a first word-line landing pad, and a second word-line landing pad formed in a first metallization layer and extending parallel to a first direction, wherein the first word-line landing pad is positioned within the rectangular shape of the first or second SRAM cell, and the second word-line landing pad is positioned within the rectangular shape of the second SRAM cell; and
a third Vss line and a first word line formed in a second metallization layer and extending parallel to a second direction, wherein the second metallization layer is positioned on the first metallization layer.

2. The SRAM structure as claimed in claim 1, wherein each of the first and second SRAM cells comprises:
a first inverter, comprising:
a first pull-down transistor formed in a first P-type well region of a substrate; and
a first pull-up transistor formed in an N-type well region of the substrate;
a second inverter cross-coupled to the first inverter, comprising:
a second pull-down transistor formed in a second P-type well region of the substrate; and
a second pull-up transistor formed in the N-type well region of the substrate;
a first pass-gate transistor formed in the first P-type well region and electrically coupled to an input terminal of the second inverter and an output terminal of the first inverter; and
a second pass-gate transistor formed in the second P-type well region and electrically coupled to an output terminal of the second inverter and an input terminal of the first inverter,
wherein the N-type well region is positioned between the first and second P-type well regions,
wherein the first word line is electrically coupled to gates of the first and second pass-gate transistors through the first and second word-line landing pads.

3. The SRAM structure as claimed in claim 2, wherein each of the first pull-down transistor, the first pass-gate transistor, the second pull-down transistor and the second pass-gate transistor formed in the first and second P-type well regions comprises a single fin or multiple fin field-effect transistor, and each of the first pull-up transistor and the second pull-up transistor formed in the N-type well region comprises a single fin field-effect transistor.

4. The SRAM structure as claimed in claim 2, wherein each of the plurality of groups further comprises:
a first bit line formed in the first metallization layer and between the first Vss line and the second Vss line, wherein the first bit line is electrically coupled to the first pass-gate transistor of the first SRAM cell;
a first power supply line formed in the first metallization layer and between the first bit line and the second Vss line;
a first complementary bit line formed in the first metallization layer and between the first power supply line and the second Vss line, wherein the first complementary bit line is electrically coupled to the second pass-gate transistor of the first SRAM cell;
a second complementary bit line formed in the first metallization layer, wherein the first word-line landing pad is between the second Vss line and the second complementary bit, and the second complementary bit line is electrically coupled to the second pass-gate transistor of the second SRAM cell;
a second power supply line formed in the first metallization layer and between the second complementary bit line and the second word-line landing pad; and
a second bit line formed in the first metallization layer and between the second power supply line and the second word-line landing pad, wherein the second bit line is electrically coupled to the first pass-gate transistor of the second SRAM cell.

5. The SRAM structure as claimed in claim 2, wherein each of the plurality of groups further comprises:
a first bit line formed in the first metallization layer and between the first Vss line and the second Vss line, wherein the first bit line is electrically coupled to the first pass-gate transistor of the first SRAM cell;
a first power supply line formed in the first metallization layer and between the first bit line and the second Vss line;
a first complementary bit line formed in the first metallization layer and between the first word-line landing pad and the first power supply line, wherein the first complementary bit line is electrically coupled to the second pass-gate transistor of the first SRAM cell;
a second complementary bit line formed in the first metallization layer and between the second Vss line and the second word-line landing pad, wherein the second complementary bit line is electrically coupled to the second pass-gate transistor of the second SRAM cell;
a second power supply line formed in the first metallization layer and between the second complementary bit line and the second word-line landing pad; and
a second bit line formed in the first metallization layer and between the second power supply line and the second word-line landing pad, wherein the second bit line is electrically coupled to the first pass-gate transistor of the second SRAM cell.

6. The SRAM structure as claimed in claim 1, wherein the first direction is perpendicular to the second direction, and metal thickness of the first word line is thicker than that of the first word-line landing pad and the second word-line landing pad.

7. The SRAM structure as claimed in claim 1, wherein each of the plurality of groups further comprises:
a fourth Vss line formed in a third metallization layer and extending parallel to the first direction,
wherein the third metallization layer is positioned on the second metallization layer, and the fourth Vss line is electrically coupled to the third Vss line.

8. The SRAM structure as claimed in claim 7, wherein each of the plurality of groups further comprises:

a second word line formed in a fourth metallization layer and extending parallel to the second direction,
wherein the fourth metallization layer is positioned on the third metallization layer, and the first word line is electrically coupled to the second word line.

9. A Static Random Access Memory (SRAM) structure, comprising:
a plurality of SRAM cells arranged in a plurality of rows and a plurality of columns,
wherein the SRAM cells in the same row are divided into a plurality of groups, and each of the plurality of groups comprises:
a first SRAM cell and a second SRAM cell adjacent to the first SRAM cell, wherein each of the first and second SRAM cells comprises:
a first inverter and a second inverter cross-coupled to the first inverter;
a first pass-gate transistor electrically coupled to an input terminal of the second inverter and an output terminal of the first inverter; and
a second pass-gate transistor electrically coupled to an output terminal of the second inverter and an input terminal of the first inverter,
a first power supply line, a second power supply line, a first Vss line, a second Vss line, a first word-line landing pad, a second word-line landing pad, a first bit line, a first complementary bit line, a second bit line and a second complementary bit line formed in a first metallization layer and extending parallel to a first direction; and
a third Vss line and a first word line formed in a second metallization layer and extending parallel to a second direction perpendicular to the first direction, wherein the second metallization layer is positioned on the first metallization layer,
wherein the first word-line landing pad is positioned within the first or second SRAM cell, and the second word-line landing pad is positioned within the second SRAM cell, and the first word line is electrically coupled to gates of the first and second pass-gate transistors of the first and second SRAM cells through the first and second word-line landing pads.

10. The SRAM structure as claimed in claim 9, wherein the first power supply line is electrically coupled to pull-up transistors of the first and second inverters of the first SRAM cell, the second power supply line is electrically coupled to pull-up transistors of the first and second inverters of the second SRAM cell, the first bit line is electrically coupled to the first pass-gate transistor of the first SRAM cell, the first complementary bit line is electrically coupled to the second pass-gate transistor of the first SRAM cell, the second bit line is electrically coupled to the first pass-gate transistor of the second SRAM cell, and the second complementary bit line is electrically coupled to the second pass-gate transistor of the second SRAM cell.

11. The SRAM structure as claimed in claim 10, wherein in each of the first and second SRAM cells, a first pull-down transistor of the first inverter and the first pass-gate transistor are formed in a first P-type well region of a substrate, a second pull-down transistor of the second inverter and the second pass-gate transistor are formed in a second P-type well region of the substrate, and a first pull-up transistor of the first inverter and a second pull-up transistor of the second inverter are formed in an N-type well region of the substrate, wherein the N-type well region is positioned between the first and second P-type well regions.

12. The SRAM structure as claimed in claim 11, wherein each of the first pull-down transistor, the first pass-gate transistor, the second pull-down transistor and the second pass-gate transistor formed in the first and second P-type well regions comprises a single fin or multiple fin field-effect transistor, and each of the first pull-up transistor and the second pull-up transistor formed in the N-type well region comprises a single fin field-effect transistor.

13. The SRAM structure as claimed in claim 9, wherein in each of the plurality of groups, the first Vss line, the first bit line, the first power supply line, the first complementary bit line, the second Vss line, the first word-line landing pad, the second complementary bit line, the second power supply line, the second bit line, and the second word-line landing pad are arranged in the first metallization layer in sequence.

14. The SRAM structure as claimed in claim 9, wherein in each of the plurality of groups, the first Vss line, the first bit line, the first power supply line, the first complementary bit line, the first word-line landing pad, the second Vss line, the second complementary bit line, the second power supply line, the second bit line, and the second word-line landing pad are arranged in the first metallization layer in sequence.

15. The SRAM structure as claimed in claim 9, wherein each of the first and second SRAM cells has a rectangular shape with an X-pitch and a Y-pitch which is shorter than the X-pitch, and the ratio of the X-pitch to the Y-pitch is greater than 2.

16. The SRAM structure as claimed in claim 9, wherein each of the plurality of groups further comprises:
a fourth Vss line formed in a third metallization layer and extending parallel to the first direction,
wherein the third metallization layer is positioned on the second metallization layer, and the fourth Vss line is electrically coupled to the third Vss line.

17. The SRAM structure as claimed in claim 16, wherein each of the plurality of groups further comprises:
a second word line formed in a fourth metallization layer and extending parallel to the second direction,
wherein the fourth metallization layer is positioned on the third metallization layer, and the first word line is electrically coupled to the second word line.

18. A Static Random Access Memory (SRAM) structure, comprising:
a cell array formed by a plurality of SRAM cells, wherein the SRAM cells in the same row are divided into a plurality of groups, and each of the plurality of groups comprises:
a first SRAM cell and a second SRAM cell adjacent to the first SRAM cell;
a first power supply line, a first word-line landing pad, a first bit line corresponding to the first SRAM cell, and a first complementary bit line corresponding to the first SRAM cell, a second power supply line, a second word-line landing pad, a second bit line corresponding to the second SRAM cell, and a second complementary bit line corresponding to the second SRAM cell, a first Vss line, and a second Vss line, formed in a first metallization layer and extending parallel to a first direction; and
a third Vss line and a first word line formed in a second metallization layer and extending parallel to a second direction perpendicular to the first direction, wherein the second metallization layer is positioned on the first metallization layer, and the first word line is electrically coupled to the first and second word-line landing pads, wherein the first word-line landing pad corresponding to the first SRAM cell is positioned within the first or second SRAM cell, and the second word-line landing pad corresponding to the second SRAM cell is positioned within the second SRAM cell, wherein widths of the first bit line, the first complementary bit line, the second bit line, and the second complementary bit line are wider than widths of the first Vss line and the second Vss line in the first metallization layer, wherein the widths of the first bit line, the first complementary bit line, the second bit line, and the second complementary bit line are narrower than that of the first power supply line and the second power supply line.

19. The SRAM structure as claimed in claim 18, wherein in each of the plurality of groups, the first Vss line, the first bit line, the first power supply line, the first complementary bit line, the second Vss line, the first word-line landing pad, the second complementary bit line, the second power supply line, the second bit line, and the second word-line landing pad are arranged in the first metallization layer in sequence.

20. The SRAM structure as claimed in claim 18, wherein in each of the plurality of groups, the first Vss line, the first bit line, the first power supply line, the first complementary bit line, the first word-line landing pad, the second Vss line, the second complementary bit line, the second power supply line, the second bit line, and the second word-line landing pad are arranged in the first metallization layer in sequence.

\* \* \* \* \*